(12) United States Patent
Vijayaraghavan et al.

(10) Patent No.: US 7,627,806 B1
(45) Date of Patent: Dec. 1, 2009

(54) INTEGRATED HARD-WIRED OR PARTLY HARD-WIRED CRC GENERATION AND/OR CHECKING ARCHITECTURE FOR A PHYSICAL CODING SUBLAYER IN A PROGRAMMABLE LOGIC DEVICE

(75) Inventors: Divya Vijayaraghavan, Mountain View, CA (US); Michael Menghui Zheng, Fremont, CA (US); Chong H. Lee, San Ramon, CA (US); Ning Xue, Fremont, CA (US); Tam Nguyen, San Jose, CA (US)

(73) Assignee: Altera Corporation, San Jose, CA (US)

( * ) Notice: Subject to any disclaimer, the term of this patent is extended or adjusted under 35 U.S.C. 154(b) by 679 days.

(21) Appl. No.: 11/436,463

(22) Filed: May 17, 2006

Related U.S. Application Data

(60) Provisional application No. 60/778,493, filed on Mar. 1, 2006.

(51) Int. Cl.
 *H03M 13/09* (2006.01)
(52) U.S. Cl. .................................................. 714/807
(58) Field of Classification Search ................. 714/807
 See application file for complete search history.

(56) References Cited

U.S. PATENT DOCUMENTS

| | | | | | |
|---|---|---|---|---|---|
| 6,115,763 | A | * | 9/2000 | Douskey et al. | 710/72 |
| 6,678,861 | B1 | * | 1/2004 | Jones et al. | 714/781 |
| 6,844,756 | B1 | * | 1/2005 | Moore | 326/39 |
| 6,874,107 | B2 | * | 3/2005 | Lesea | 714/725 |
| 7,091,745 | B1 | * | 8/2006 | Jacobson | 326/41 |
| 7,112,992 | B1 | * | 9/2006 | Guzman et al. | 326/38 |
| 7,343,483 | B1 | * | 3/2008 | May et al. | 713/1 |
| 7,356,756 | B1 | * | 4/2008 | Chan et al. | 714/781 |
| 7,483,442 | B1 | * | 1/2009 | Torudbaken et al. | 370/412 |
| 7,502,815 | B1 | * | 3/2009 | Drimer | 708/255 |

\* cited by examiner

*Primary Examiner*—Stephen M Baker
(74) *Attorney, Agent, or Firm*—Ropes & Gray LLP

(57) ABSTRACT

A programmable logic integrated circuit device ("PLD") includes high-speed serial interface ("HSSI") circuitry that is at least partly hard-wired to perform at least some functional aspects of the HSSI operations. Cyclic redundancy check (CRC) generation and/or checking circuitry is now included in this HSSI circuitry, and again, this CRC circuitry is at least partly hard-wired to perform at least some functional aspects of its operations(s).

23 Claims, 4 Drawing Sheets

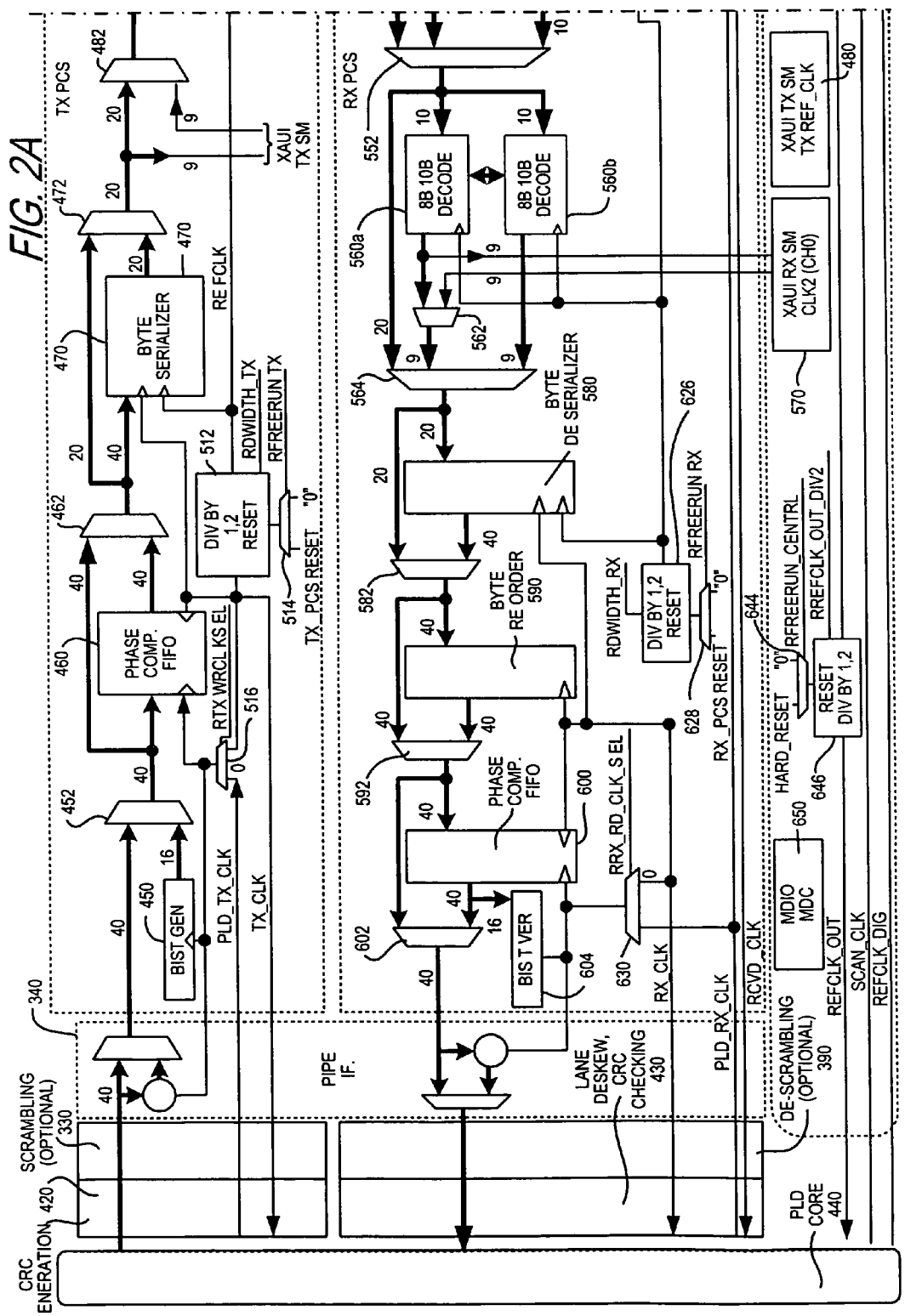

US 7,627,806 B1

INTEGRATED HARD-WIRED OR PARTLY HARD-WIRED CRC GENERATION AND/OR CHECKING ARCHITECTURE FOR A PHYSICAL CODING SUBLAYER IN A PROGRAMMABLE LOGIC DEVICE

This application claims the benefit of U.S. provisional patent application No. 60/778,493, filed Mar. 1, 2006, which is hereby incorporated by reference herein in its entirety.

BACKGROUND OF THE INVENTION

This invention relates to programmable logic device integrated circuits and the like, all of which are referred to generically herein as PLDs. More particularly, the invention relates to high-speed serial interface ("HSSI") circuitry for inclusion in PLDs.

There is increasing interest in using high-speed serial data signals for exchanging information between devices in various types of systems. The speeds (serial data rates) that are desired for such communication are constantly increasing, and the various protocols that may be used for such communication are also increasing in both number and sophistication. Some of these protocols use several serial data signals in a coordinated way (i.e., each serial data signal includes only part of the data being communicated). Some protocols require the use of cyclic redundancy check ("CRC") technology.

It may be desired to use PLDs in systems employing high-speed serial data signals as described in the preceding paragraph. PLDs are relatively general-purpose devices that are capable of supporting any of many different possible uses. A PLD is programmed or "configured" to perform the operations that are required in a particular use. PLDs include general-purpose logic circuitry, which is typically the major portion of the device. Most of such "PLD core" circuitry is programmable to perform any of a wide range of possible logic tasks or the like (although PLD core circuitry may also include some relatively specialized circuitry such as blocks of random access memory ("RAM"), processor or microprocessor circuitry, digital signal processing ("DSP") circuitry, etc., which is at least partly hard-wired to perform at least some particular functions). It is also known to include HSSI circuitry on PLDs to help the PLD support high-speed serial digital data communication. Again, such HSSI circuitry may be at least partly hard-wired to perform at least some functional aspects of the HSSI operation. The HSSI circuitry on a PLD may include a transmitter portion for accepting successive bytes or groups of bytes of parallel data (e.g., from the PLD core), serializing that data, and outputting the result as a high-speed serial data signal. Other operations (e.g., 8-bit-to-10-bit encoding) may also be performed on the data in the HSSI transmitter circuitry. Alternatively or in addition, the HSSI circuitry on a PLD may include a receiver portion for receiving a high-speed serial data signal, converting that data to successive bytes or groups of bytes of parallel data, and applying the parallel data to the PLD core. Again, other operations (e.g., 10-bit-to-8-bit decoding) may also be performed on the data in the HSSI receiver circuitry. If CRC operations are required in PLD implementations of high-speed data signaling, those operations have typically been performed in the general-purpose PLD core circuitry of the device.

SUMMARY OF THE INVENTION

In accordance with the present invention, CRC generation and/or CRC checking circuitry is included in the at least partly hard-wired portion of a PLD. In the case of CRC generation, for example, CRC generation circuitry is included between the PLD core and HSSI transmitter circuitry of the PLD. The CRC generation circuitry is usable to operate on successive packets of data output by the PLD core prior to full serialization of that data by the remainder of the HSSI transmitter circuitry. The CRC generation circuitry can operate without stalling packets or increasing the inter-packet gap. The CRC generation circuitry is at least partly hard-wired to perform at least some functional aspects of its operation. The CRC generation circuitry may also be partly programmable or otherwise controllable so that it can perform any of several CRC generation functions (e.g., any of several types of CRC generation). In the case of CRC checking, CRC checking circuitry is included between the HSSI receiver and PLD core circuitry of the PLD. The CRC checking circuitry is usable to operate on successive packets of parallel data produced by the remainder of the HSSI receiver circuitry, typically from several received high-speed serial data signals. The CRC checking circuitry can operate without stalling packets or increasing the inter-packet gap. The CRC checking circuitry is at least partly hard-wired to perform at least some functional aspects of its operation. The CRC checking circuitry may also be partly programmable or otherwise controllable so that it can perform any of several CRC checking functions (e.g., any of several types of CRC checking).

Further features of the invention, its nature and various advantages, will be more apparent from the accompanying drawings and the following detailed description.

DETAILED DESCRIPTION

Figure 1:
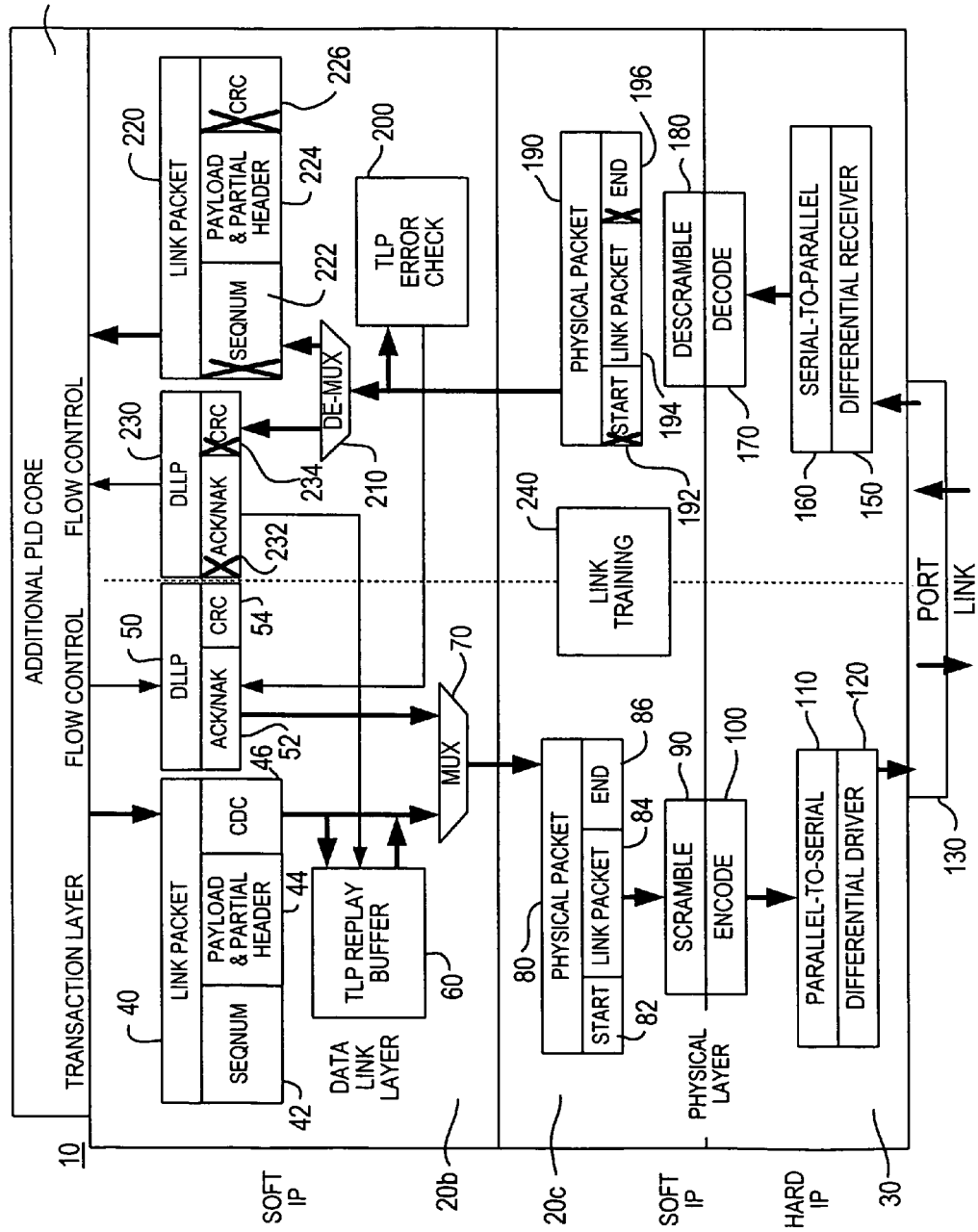
FIG. 1 is a simplified schematic block diagram of illustrative prior art circuitry.

FIG. 1 shows an illustrative known way of including CRC capability in a PLD 10. The major portions of PLD 10 that are shown in FIG. 1 include PLD core circuitry 20 (including sections 20a, 20b, and 20c) and so-called "hard IP" circuitry 30. (IP stands for intellectual property.) PLD core circuitry 20 is typically the major portion of the PLD. It includes general-purpose programmable logic and general-purpose programmable interconnect. It may also include some relatively special-cial-purpose components such as blocks of random access memory ("RAM"), digital signal processing ("DSP") blocks, processor or microprocessor blocks, etc. But, overall, it is generally regarded as general-purpose circuitry that is programmable or configurable to perform any functions (e.g., logic functions) within a wide range of possible functions.

Some portions of PLD core 20 (i.e., portions 20b and 20c) are labeled "soft IP." These are portions of PLD core 20 that can be programmed or configured, if desired, to support certain aspects of high-speed serial data communication. If such communication is not desired for some uses of PLD 10, soft IP circuitry 20b and 20c can be put to other uses, because (like circuitry 20a) it is general-purpose circuitry that does not have to be used in the particular way that is shown in FIG. 1. Hard IP circuitry 30, on the other hand, is circuitry that is at least partly hard-wired for performing the high-speed serial data communication functions indicated in the various boxes in section 30 of FIG. 1. Such circuitry may sometimes be referred to as "dedicated" circuitry. Very often, if this dedicated circuitry is not needed for the particular tasks for which it is designed, it cannot be used for other tasks and is therefore, in effect, wasted. Although hard IP 30 is thus dedicated to performing particular functions, it may be programmable or configurable in some limited respects to vary the functions performed. For example, parallel-to-serial converter 110 may be programmable to accept parallel data having any of several widths.

Assuming that the circuitry of PLD 10 is set up for high-speed serial data communication as shown in FIG. 1, PLD core portion 20a may be referred to as the transaction layer (i.e., the circuitry where data to be transmitted originates, and where received data is utilized); PLD core portion 20b may be referred to as the data link layer; and PLD core portion 20c and hard IP 30 may be referred to collectively as the physical layer. FIG. 1 shows illustrative high-speed serial data transmitter circuitry on the left, and high-speed serial data receiver circuitry on the right. The transmitter circuitry will be described first.

The FIG. 1 transmitter circuitry is set up to handle two different kinds of data or information transmissions. These are link packets 40 and data link layer packets 50 ("DLLP"). (Throughout this discussion reference numbers are used for both the circuitry that generates, stores, or conveys signals or information, and also for the associated signals or information.) A link packet or transaction layer packet ("TLP") 40 originates from transaction layers 20a and includes payload and partial header information 44. The payload is the actual data to be transferred. Additional header information (i.e., a sequence number 42 and a cyclic redundancy code ("CRC") 46) is added in data link layer 20b. The arrangement shown in FIG. 1 implies that general-purpose logic 20b is fast enough to keep up with the data rates employed so as to be able to compute and add CRC 46 to each successive link packet 40.

The other type of information that the FIG. 1 circuitry is set up to transmit is DLLP 50 information. DLLP 50 may be used for such purposes as flow control, rather than to send any real payload data. For example, FIG. 1 shows DLLP 50 including acknowledge/not-acknowledge ("Ack/Nak") portion 52 and CRC portion 54. Some basic flow control information may come to DLLP 50 from transaction layer 20a, but Ack/Nak 52 and CRC 54 are basically supplied by data link layer 20b.

Link packet 40 is applied to TLP replay buffer circuitry 60 and also to one set of input terminals to multiplexer ("mux") circuitry 70. DLLP 50 is applied to the other set of input terminals to mux 70. Mux 70 is dynamically controlled to select either of its sets of input terminals as the source of the signals it outputs.

The packet output by mux 70 in data link layer 20b becomes the physical packet 80 in the soft IP portion of physical layer 20c/30. In particular, soft IP 20c adds start 82 and end 86 information to the packet information 84 that has come from mux 70. (Packet information 84 is labeled as though from source 40, but that information could alternatively be from source 50.) A special character (a "K character") may be used for start information 82, and another K character may be used for end information 86.

The serial data transmission protocol being used may require the data to be transmitted to be broken down for transmission via several parallel data channels or lanes, in each of which lanes the associated portion of the data in transmitted serially. Through the point in FIG. 1 that has thus far been described, all of the data that is to be transmitted is handled together as a unit. If several lanes are to be used for transmission, it is at the output of circuitry 80 that the various bytes of the physical packet are separated for further processing and transmission on a lane-by-lane basis. Thus, assuming that several lanes are to be used, the elements below circuitry 80/82/84/86 in FIG. 1 are lane-by-lane circuitry.

In circuitry 90 each byte to be transmitted may be scrambled, e.g., using any of several selectable scrambling techniques.

In circuitry 100 each byte to be transmitted may be encoded, e.g., using 8-bit-to-10-bit encoding. (The term "8B10B" or "8B10B coding" will sometimes be used generically herein in connection with both 8-bit-to-10-bit encoding and 10-bit-to-8-bit decoding.)

In circuitry 110 the parallel data output by the upstream circuitry is converted to a single serial data signal. Differential driver circuitry 120 is typically used to apply the serial data signal to port circuitry 130 as a differential signal pair, which is then applied to a link external to PLD 10. (Although differential signaling is very often employed, the two signals of such a differential signal pair actually represent only a single stream of serial data, and so a differential signal pair may sometimes be referred to simply as a serial data signal. This terminology should not be interpreted as inconsistent with the possibility that a differential signal pair may actually be used for transmission of the serial data between devices in a system.)

We turn now to the receiver side of FIG. 1. Elements 150, 160, 170, and 180 are provided on a lane-by-lane basis. Elements above element 180 deal with entire packets.

Figure 2B:
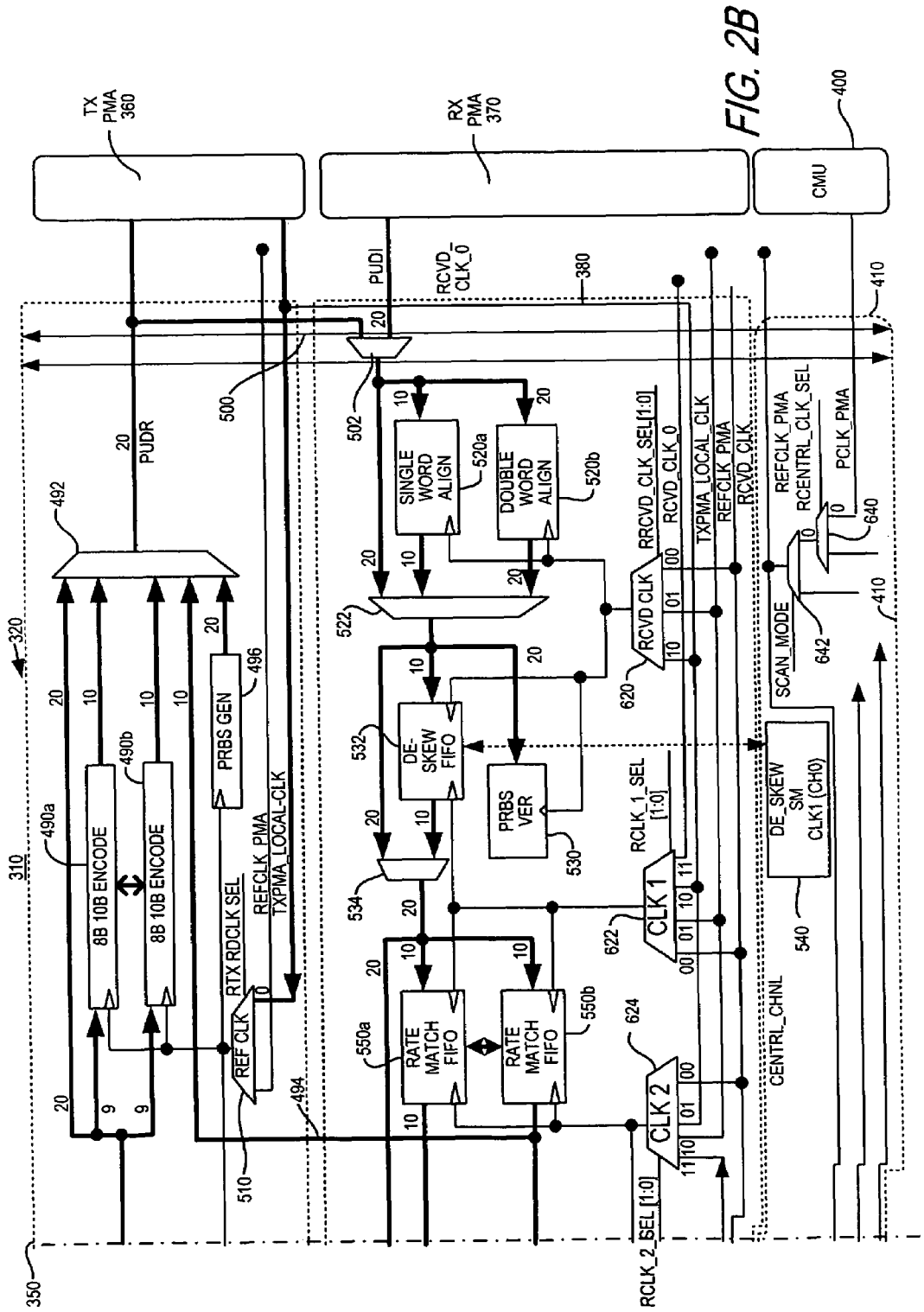
FIG. 2 is a simplified schematic block diagram of an illustrative embodiment of circuitry in accordance with the invention.

Differential receiver 150 receives a serial data signal (which, again, may actually be a differential signal pair received from an external link via port circuitry 130 of PLD 10). Receiver 150 converts the signal it receives to a single-ended signal, which is applied to serial-to-parallel converter circuitry 160. (In the interest of simplicity, FIG. 1 does not show components that may be required for such purposes as clock and data recovery, byte alignment, deskew, etc. Some of that additional detail is shown in FIG. 2, although even there it tends to be background to, rather part of, the present invention.)

Serial-to-parallel converter circuitry 160 converts the serial data signal it receives to several parallel signals representing that same data.

Circuitry 170 may be used to decode the parallel data (e.g., performing a 10-bit-to-8-bit decoding of that data). The operation of circuitry 170 is typically complementary to (i.e., it can reverse) the operation of circuitry 100.

Circuitry 180 may be used to descramble the data it receives (e.g., using any of several selectable descrambling techniques). Again, the operation of circuitry 180 may be complementary to or the reverse of the operation of circuitry 90.

Outputs of the circuitry below circuitry 190/192/194/196 are applied to circuitry 190/etc. Again, if multiple lanes are being used, this is the point at which the data from all lanes comes together for further processing. Accordingly, circuitry 190/etc. contains a physical packet, including start information 192, link packet 194, and end information 196. (Although link packet terminology is used to refer to circuit element 194, it will be understood that this may also be DLLP information.) As indicated by the Xs associated with circuit elements 192 and 196, this is the point at which the start and end information is stripped off the link packet.

Circuitry 190/etc. applies the link packet information to TLP error check circuitry 200, and also to inputs of demultiplexer ("de-mux") circuitry 210. Circuitry 200 can perform various checks on the information that has been received, and, depending on the results of those checks, can cause circuitry 50/52/54 to send back an "Ack" response or a "Nak" response. Note that the checks performed by circuitry 200 typically make use of the sequence number and CRC information that comes with a packet. Thus, again, FIG. 1 assumes a configuration in which soft IP data link layer 20b can perform these checks (including cyclic redundancy checking) fast enough to keep up with the data being received.

De-mux 210 is dynamically controlled to route link packets to link packet circuitry 220/222/224/226, and to route DLLP information to DLLP circuitry 230/232/234. As is implied by the Xs on circuit elements 222 and 226, this is where the sequence number and CRC information are discarded.

Circuitry 220/222/224/226 passes on the remaining information to PLD core transaction layer circuitry 20a.

On the DLLP 230/232/234 side, if a "Nak" has been received, circuitry 232 causes TLP replay buffer 60 to retransmit the data that caused the "Nak". Circuitry 230 passes on any flow control information to PLD core transaction layer 20a.

Link training 240 is a protocol-specific initialization sequence that determines the link ID and number of channels used in the link.

As has been noted on a couple of occasions above, circuitry of the type shown in FIG. 1 can be used in situations in which general-purpose PLD core circuitry can perform CRC generation and checking operations fast enough to keep up with the rate at which data is being transmitted and/or received. This may not be possible for more advanced communication protocols having such characteristics as higher data rates, more lanes, etc. The present invention can then be used to provide CRC and associated operations for such more advanced protocols.

A representative portion of an illustrative embodiment of transceiver circuitry on a PLD 310 in accordance with the invention is shown in FIG. 2. This FIG. shows one representative HSSI transceiver channel 320 and circuitry that is associated with that channel. As will become apparent, some of the associated circuitry is shared with other transceiver channels on PLD 310 that are not shown in FIG. 2, although such other transceiver channels are typically similar to the channel 320 shown in FIG. 2.

Transceiver channel 320 includes scrambling circuitry 330, PIPE interface circuitry 340, transmit physical coding sublayer ("TX PCS") circuitry 350, and TX physical media access ("PMA") circuitry 360 on the transmit side. On the receiver side, channel 320 includes receiver PMA ("RX PMA") circuitry 370, RX PCS circuitry 380, another portion of PIPE interface 340, and de-scrambling circuitry 390. Transceiver channel 320 shares with other similar channels clock multiplier unit ("CMU") circuitry 400 and central channel circuitry 410. Transceiver channel 320 also shares with other similar channels CRC generation circuitry 420 and lane deskew and CRC checking circuitry 430. PLD core circuitry 440 in FIG. 2 can be similar to the PLD core circuitry described above in connection with FIG. 1.

In accordance with the present invention, CRC generation circuitry 420, lane deskew and CRC checking circuitry 430, scrambling circuitry 330, de-scrambling circuitry 390, PIPE interface 340, TX PCS circuitry 350, and RX PCS circuitry 380 are all physical coding sublayer ("PCS") circuitry of PLD 310. (Central channel circuitry 410 is also typically PCS circuitry.) This means that these various circuitries are implemented using functional circuit blocks that are at least partly hard-wired to perform required functions. Another way of saying this is that dedicated circuitry is used for or in these various circuitries. These circuitries are not implemented using general-purpose logic circuitry like PLD core 440. Rather, special-purpose circuitry is used to implement these circuitries. Certain aspects of the operation of these circuitries may be selectable (e.g., by dynamic control or by programmable (configuration) control). But, at least for the most part, the operation of the various components in PCS circuitry 420/430/330/340/350/380/390 is dedicated to particular functions or types of functions.

Considering FIG. 2 now in more detail, CRC generation circuitry 420 performs functions like some of those described above in connection with elements 40, 42, 44, 46, 50, 52, and 54 in FIG. 1. Scrambling circuitry 330 performs functions like those described above for element 90 in FIG. 1. (Scrambling is optional and can be bypassed if not needed in a particular use of the circuitry.) PIPE interface circuitry 340 is an industry-standard interface configuration that it is convenient to use in this context. The transmitter portion of circuitry 340 can output up to 40 data bits in parallel. BIST GEN circuitry 450 is circuitry that can generate a test pattern, if desired. Multiplexer ("mux") circuitry 452 can select to output either the data output by circuitry 340 or the test pattern output by circuitry 450. The output signals of mux 452 are applied to phase compensation FIFO circuitry 460 and also to one set of the input terminals of mux 462. Circuitry 460 can be used (if desired) to compensate for any phase mis-match between clock signals used upstream from circuitry 460 and clock signals used downstream from that circuitry. The output signals of circuitry 460 are applied to a second set of inputs to mux 462. Mux 462 can select to output either of its two sets of inputs. In this way circuitry 460 can be either used or bypassed as desired.

The output signals of mux 462 are applied to byte deserializer circuitry 470 and a subset of those signals is applied to one set of the inputs to mux 472. Circuitry 470 can be used to break down one block of up to 40 parallel bits to two successive blocks, each having up to 20 parallel bits. The outputs of circuitry 470 are applied to the second set of inputs to mux 472. Mux 472 can select to output either of its two sets of inputs. In this way circuitry 470 can be either used (if the upstream circuitry is supplying up to 40 parallel bits) or bypassed (if the upstream circuitry is supplying only up to 20 parallel bits).

The output signals of mux 472 are applied to XAUI TX state machine ("SM") circuitry 480 and also to one set of the inputs to mux 482. Signals from circuitry 480 are applied to the other set of inputs to mux 482. Mux 482 can select to output either of its two sets of inputs. In this way circuitry 480 can be either used or bypassed as desired.

A first subset of the output signals of mux 482 are applied to 8B/10B encode circuitry 490a, and a second subset of the output signals of mux 482 are applied to 8B/10B encode circuitry 490b. The output signals of mux 482 are also applied to a first set of the inputs to mux 492. Each of circuits 490 can perform 8B/10B encoding on the signals applied to that circuit. The outputs of circuitry 490a are applied to a second set of inputs to mux 492, and the outputs of circuitry 490b are applied to a third set of inputs to mux 492. A fourth set of inputs 494 to mux 492 are loop-back signals from circuitry 380 (for test purposes). A fifth set of inputs to mux 492 are test signals from test signal generator circuitry 496. Mux 492 can select to output any of its various input signals. For example, if mux 492 selects its first set of input signals, circuits 490 are bypassed. Alternatively, mux 492 can select its second set of inputs if only circuitry 490a is in use (only one 8-bit byte is coming from upstream at a time). As another alternative, mux 492 can select its second and third sets of inputs if both of circuits 490 are in use (two 8-bit bytes are coming from upstream in parallel). As still another example, a loop-back test can be performed by having mux 492 select its fourth set of inputs. Another type of test can be performed by having mux 492 select its fifth set of inputs.

The output signals of mux 492 are applied to TX PMA circuitry 360, and also (via loop-back connections 500) to one set of the inputs to mux 502. Circuitry 360 includes parallel-to-serial converter circuitry and differential output driver circuitry as described above in connection with FIG. 1.

Elements like 510, 512, 514, and 516 relate to the distribution of various clock signals throughout the above-described circuitry. It will not be necessary to describe such clock details beyond what has already been said and what will be readily apparent to those skilled in the art from FIG. 2 itself.

On the receiver side, RX PMA circuitry 370 includes differential input buffer and serial-to-parallel converter circuitry as described above in connection with FIG. 1. RX PMA circuitry 370 may also include clock and data recovery ("CDR") circuitry. The parallel data output signals of circuitry 370 (up to 20 parallel bits) are applied to the second set of inputs to mux 502. Mux 502 can select to output either of its sets of inputs. The outputs of mux 502 can therefore either be loop-back test signals 500, or received data signals from circuitry 370.

The output signals of mux 502 are applied to a first set of the inputs of mux 522. The output signals of mux 502 are also applied to double word align circuitry 520b. A subset of the output signals of mux 502 are applied to single word align circuitry 520a. If mux 20 is outputting up to 20 bits, and if word alignment is desired, circuitry 520b is used to perform that alignment. If mux 20 is outputting only up to 10 bits, and if word alignment is desired, circuitry 520a is used to perform that alignment. The output signals of circuitry 520a are applied to a second set of inputs to mux 522. The output signals of circuitry 520b are applied to a third set of inputs to mux 522. Mux 522 can select to output any of its sets of inputs. For example, if word alignment is not desired, mux 522 can select its first set of inputs to bypass circuits 520. If single word alignment is desired, mux 522 can select its second set of inputs. If double word alignment is required, mux 522 can select its third set of inputs.

The output signals of mux 522 are applied to test signal verification circuitry 530. Circuitry 530 can be used in conjunction with circuitry 496 to test whether circuitry connected between the two is operating properly. The output signals of mux 522 are also applied to a first set of the inputs to mux 534. A subset of the output signals of mux 522 are applied to deskew FIFO circuitry 532. Circuitry 532 works with deskew state machine ("SM") circuitry 540 in central channel 410 to eliminate (or at least reduce) differential delay ("skew") between data reception in two or more channels that are being used together to provide a communication link in which skew is not permitted or must be limited to a predetermined maximum amount. Circuitry 532 provides what is referred to for convenience herein as static deskew. The output signals of circuitry 532 are applied to the second set of inputs to mux 534. Mux 534 can select to output either of its two sets of inputs. Accordingly, mux 534 allows circuitry 532 to be either used or bypassed, as desired.

The output signals of mux 534 are applied to a first set of the inputs to mux 552. First and second subsets of the output signals of mux 534 are respectively applied to rate matching FIFO circuits 550a and 550b. Circuits 550 compensate for possible data rate differences between the circuitry upstream from these circuits and the circuitry downstream from these circuits. The output signals of circuits 550a and 550b are respectively applied to second and third sets of inputs to mux 552. The outputs of circuit 550b are also applied to loop-back connections 494. Mux 552 can select to output either its first set of inputs, its second set of inputs, or its second and third sets of inputs. Accordingly, mux 552 allows circuitry 550 to be variously used or bypassed, as desired.

The output signals of mux 552 are applied to a first set of the inputs to mux 564. First and second subsets of the output signals of mux 552 are also respectively applied to 8B/10B decoder circuitries 560a and 560b. Each of circuitries 560 can convert a 10-bit byte to an 8-bit byte using conventional 8B/10B decoding. The output signals of circuitry 560a are applied to a first set of the inputs to mux 562 and to XAUI receiver state machine circuitry 570 in central channel circuitry 410. The output signals of circuitry 570 are applied to the second set of inputs to mux 562. Mux 562 can select to output either of its two sets of inputs. Mux 562 therefore allows circuitry 570 to be either used or bypassed, as desired. The output signals of mux 562 are applied to the second set of inputs to mux 564. The output signals of circuitry 560b are applied to the third set of inputs to mux 564. Mux 564 can select to output either its first set of inputs, its second set of inputs, or its second and third sets of inputs. Accordingly, mux 564 allows circuits 560/570 to be variously used or bypassed, as desired.

The output signals of mux 564 are applied to a first set of the inputs to mux 582 and also to byte deserializer circuitry 580. Circuitry 580 can be used to deserialize two successive groups of up to 20 bits each to produce up to 40 parallel output bits. The output signals of circuitry 580 are applied to the second set of inputs to mux 582. Mux 582 can select to output either of its two sets of inputs. Accordingly, mux 582 allows circuitry 580 to be either used or bypassed, as desired.

The output signals of mux 582 are applied to a first set of inputs to mux 592 and also to byte re-ordering circuitry 590. Circuitry 590 can be used to reorder the bytes it receives, if desired. The output signals of circuitry 590 are applied to the second set of inputs to mux 592. Mux 592 can select to output either of its two sets of input signals. Accordingly, mux 592 allows circuitry 590 to be either used or bypassed, as desired.

The output signals of mux 592 are applied to a first set of inputs to mux 602 and also to phase compensation FIFO circuitry 600. Circuitry 600 can be used to compensate for a possible phase difference between the clock used upstream from circuitry 600 and the clock used downstream from that circuitry. The output signals of circuitry 600 are applied to the second set of inputs to mux 602 and also to test signal verification circuitry 604. Elements 450 and 604 can be used together in a loop-back mode to verify operation of the circuitry between them (i.e., the entire transmit and receive data paths). Mux 602 can select to output either of its two sets of inputs. Accordingly, mux 602 allows circuitry 600 to be either used or bypassed, as desired.

The output signals of mux 602 pass through the receiver portion of PIPE interface circuitry 340 to optionally usable descrambling circuitry 390. Then the received data is processed by lane deskew and CRC checking circuitry 430. Note that lane deskew can be performed either prior to rate matching (i.e., using circuitry 532/540) in protocols like XAUI, or following descrambling in hard IP circuitry 430 in accordance with one possible aspect of the present invention. From circuitry 430, the received information can flow to PLD core circuitry 440.

Elements like 620, 622, 624, 626, 628, and 630 are used for clock distribution throughout circuitry 380. CMU 400 can be the source of some of these clock signals. Elements like 640,

642, 644, and 646 are further clock distribution elements. As for other clock features, these elements will be clear to those skilled in the art from what has been said above and from what is shown in the FIGS. Element 650 is a conventional element that will be understood by those skilled in the art.

Figure 3:
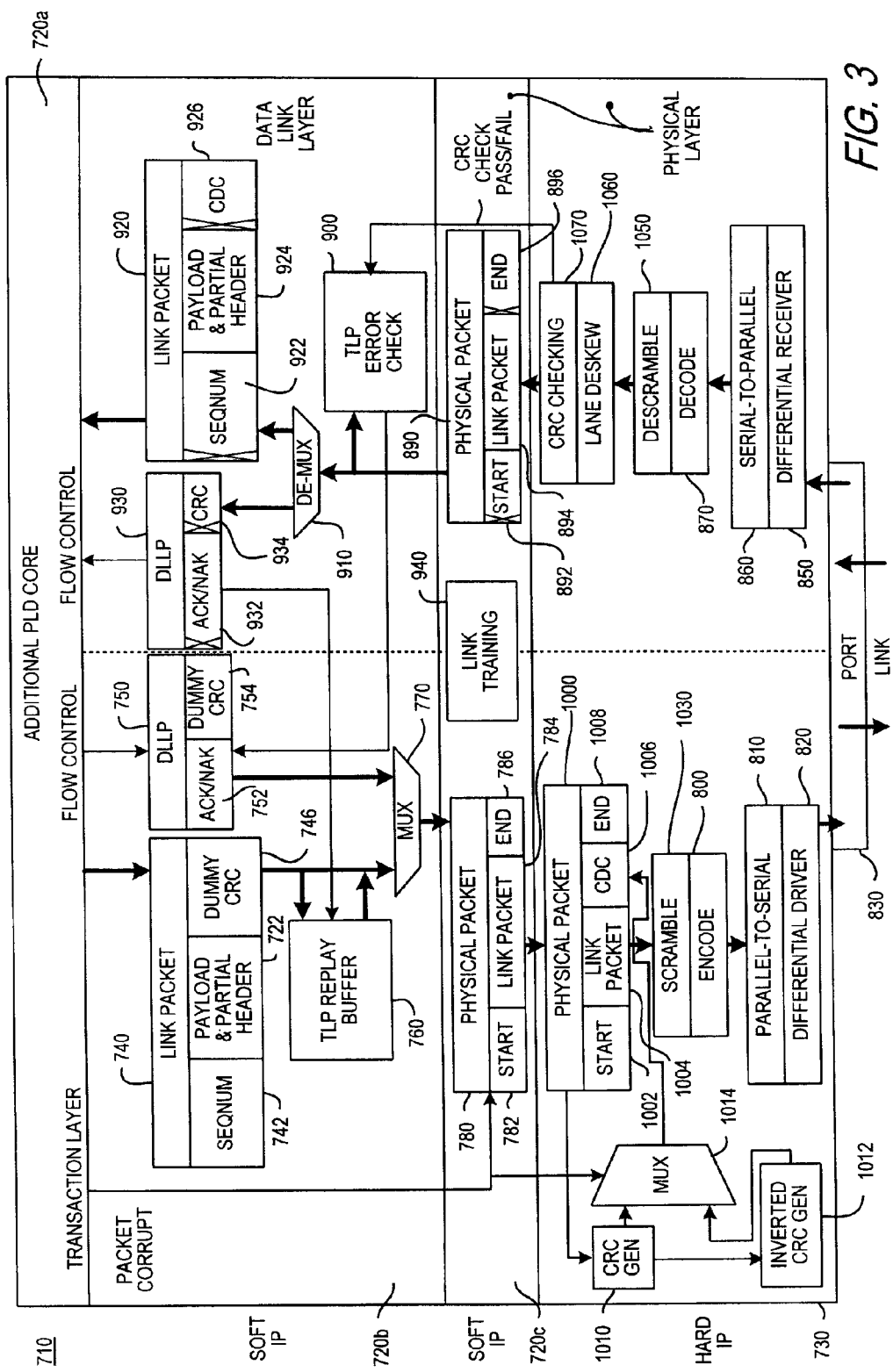
FIG. 3 is another simplified schematic block diagram of an illustrative embodiment of circuitry in accordance with the invention.

FIG. 3 shows an illustrative embodiment of modification of the general type of circuitry that is shown in FIG. 1 in accordance with this invention. Elements in FIG. 3 that have reference numbers in 700s, 800s, and 900s can be generally similar to elements in FIG. 1 that have reference numbers that are 700 less. Thus, for example, elements 60 and 760 can be generally similar, elements 130 and 830 can be generally similar, and elements 210 and 910 can be generally similar. It will therefore not be necessary to describe elements having reference numbers in the 700s, 800s, and 900s, although a few exceptions to this rule will be made.

In comparing FIGS. 1 and 3, it will be noted soft IP portion 720b of the PLD core in FIG. 3 does not compute the CRC for link packet 740 or DLLP 750. Instead, soft IP portion 720b merely adds dummy CRC information 746 and 754 to these packets.

On the transmitter side in FIG. 3 soft IP portion 720c can receive a packet corrupt signal from PLD core 720a. This is a signal that can be used to cause the transmitter circuitry to send an intentionally corrupted packet. Such a packet may be indicated (at least in part) by having a special end character 786. Accordingly, soft IP 720c can respond to assertion of the corrupt packet signal by appending the end character 786 appropriate for a corrupt packet to the end of physical packet 780 rather than appending the normal end character.

Also on the transmitter side in FIG. 3 hard IP 730 receives the physical packet from soft IP 720c with only dummy CRC information where the real CRC information should be. Hard IP circuitry 730 includes at least partly hard-wired CRC generation circuitry 1010 for computing the appropriate real CRC information from the link packet 1004 information in physical packet 1000. Hard IP circuitry 730 also includes at least partly hard-wired inverted CRC generation circuitry 1012 for generating inverted CRC information for use as the CRC information of an intentionally corrupted physical packet 1000. Multiplexer ("mux") circuitry 1014, which is controlled by the corrupt packet signal, applies either the real or inverted CRC information to physical packet 1000 for use in replacing the dummy CRC information that is initially received by hard IP 730.

In FIG. 3 hard IP circuitry 730 still further includes at least partly hard-wired scrambling circuitry 1030. Circuitry 1030 performs a function similar to circuitry 90 in FIG. 1, but circuitry 1030 is hard IP (i.e., at least partly hard-wired to perform its function) rather than soft IP as in the case of soft IP portion 90 in FIG. 1. As in the case of FIG. 1, scrambling 1030 is the point, on the transmitter side, at which data handling is broken down into individual lanes (a lane being the circuitry that ultimately leads to a single serial data output connection). Upstream from scrambling 1030, the data of all lanes that will be used to send a stream of packets is handled collectively (e.g., as whole packets, regardless of how many lanes will be used to transmit that data).

The remainder of the transmitter side circuitry in FIG. 3 can be similar to the corresponding portion of FIG. 1 (and as shown in more detail in FIG. 2).

The initial part of the receiver side of FIG. 3 can also be similar to the corresponding part of FIG. 1 (which again can be as shown in more detail in FIG. 2). Different from FIG. 1, at least partly hard-wired descrambling circuitry 1050 is included in hard IP 730 in FIG. 3. Also included in hard IP 730 in FIG. 3 is at least partly hard-wired lane deskew circuitry 1060. Whereas descrambler circuitry 1050 is provided for each received lane, lane deskew circuitry 1060 operates on all the lanes that are being used to send a stream of packets. Lane deskew circuitry 1060 ensures that bytes that are received from the various lanes being employed are properly synchronized with one another for assembly into packets corresponding to the packets that a transmitter sent to the receiver. Lane deskew circuitry 1060 produces data for all receiver lanes that are being used together to receive a stream of packets. The outputs of lane deskew circuitry 1060 are ready for CRC checking.

Also on the receiver side, hard IP 730 includes at least partly hard-wired CRC checking circuitry 1070. Circuitry 1070 may be similar to CRC generation circuitry 1010, in that it computes what the CRC information for the received CRC link packet should be, and then it compares what it computes to the CRC information received with that packet. If the computed and received CRC information are the same, the CRC check has been passed. If the computed and received CRC information are not the same, the CRC check has failed. Circuitry 1070 applies a CRC check pass/fail signal to TLP error check soft IP 900. As compared to FIG. 1, TLP error check 900 no longer needs to perform CRC checking, but it does need to know whether or not a packet passed or failed the CRC check that is now performed by hard IP circuit element 1070.

The remainder of the receiver portion of FIG. 3 can be similar to the corresponding portion of FIG. 1.

Recapitulating some of the above, integrated CRC generation in the PCS 730 involves signaling at the PCS-PLD interface (between elements 720c and 730 in FIG. 3) to enable CRC generation in the PCS. This feature further includes optional data scrambling (protocol-specific) 1030 in the PCS following CRC generation 1010, with the ability to bypass any data scrambling capability in the media access control ("MAC") layer (i.e., the combination of soft IP portions 720b and 720c). Note specifically that scrambling 1030 is preferably optional and bypassable if not needed or desired in a particular protocol.

Integrated CRC generation in PCS 730 still further involves the ability of the MAC layer to insert a dummy CRC field 746 or 754 into outgoing packets. This feature further includes replacement of the dummy CRC with the CRC 1006 generated by PCS 730 after packet delimiter 782/786 insertion but prior to scrambling 1030. The position of the CRC field within the packet is determined by the decoding of protocol-specific packet type and packet length fields. Alternatively, an identifying data pattern such as a sequence of reserved K characters (special characters) could identify the position of the dummy CRC 746 or 754. This work (of locating the CRC field within the packet) can be part of what is done by CRC generation circuitry 1010. Variations may be due to such factors as packet type and length of payload. Circuitry 1010 can get information about such variations from the packet header and/or from examining other attributes of physical packet 1000. Circuitry 1010 can then generate the appropriate type and amount of CRC information, and can control insertion of that information into physical packet 1000 at the proper location (i.e., to replace the initially supplied dummy CRC information).

Integrated CRC generation in PCS 730 still further involves signaling at the PCS-PLD interface to indicate a nullified or intentionally corrupted packet, thereby enabling PCS 730 to invert the generated CRC (using circuitry 1012) as is required by a number of serial protocols.

If desired, CRC generator circuitry 1010 can include two parallel CRC generators to address a packet ending and the next packet starting in the same symbol time. For example, in an eight-lane communication link, the last byte of a packet may be in lane 4 and the first byte of the next packet may be in lane 5. The first packet can be processed in one of the two parallel CRC generators, which can finish processing the first packet while the second parallel CRC generator can begin processing the next packet without the necessity for any delay or gap between successive packets. As an alternative, only one CRC generator is needed if, for example, delay between successive packets is permitted or if the number of lanes required to transmit each packet is always the number of lanes in the communication link. Under conditions such as these, the MAC layer could be restricted to initiating transmitted packets only on lane 0.

Transmitting packets back-to-back (i.e., with no time delay between successive packets) can be facilitated by including additional pipelining registers upstream from circuitry 1000. CRC generation circuitry 1010 can then get the data it needs for CRC generation from such an upstream register. This gives CRC generation circuitry 1010 more time to complete its calculations before the results must be supplied to circuitry 1000. This approach can be employed so that CRC generation does not stall or delay the sending of any packets, and packets can accordingly be sent back-to-back.

Continuing with the recapitulation, now on the receiver side, integrated CRC checking in the PCS 730 involves optional descrambling 1050 of incoming data in the PCS prior to CRC checking 1070. This is accompanied by the ability to bypass any data descrambling capability that may be provided in MAC layer 720b and 720c. It is again specifically noted here that descrambling circuitry 1050 can be bypassed if scrambling/descrambling is not being employed.

Lane deskewing 1060 is provided in PCS 730 prior to CRC checking 1070. Lane deskewing after descrambling implies per-channel (per-lane) descramble enabling.

CRC checking 1070 is performed on all packet fields excluding packet delimiters. The position of the CRC field within the packet is determined by the decoding of protocol-specific packet-type and packet-length fields. This decoding can be performed by CRC checking circuitry 1070 operating on the header portion of each received packet.

CRC checking circuitry 1070 includes the capability in PCS 730 of detecting a nullified or intentionally corrupted incoming packet with an inverted CRC (and possibly also a special packet-end character indicative of such a packet).

Just as CRC generation circuitry 1010 may include two parallel CRC generators for reasons that are described earlier, CRC checking circuitry 1070 may also include two parallel CRC checking circuits for similar reasons. Again, this capability may be provided to address a packet ending and the next packet starting in the same symbol time and therefore in lanes other than a predetermined starting lane such as lane 0.

CRC pass/fail signaling is required as part of the PCS-PLD interface.

Pipelining registers may be added between lane deskew circuitry 1060 and CRC checking circuitry 1070 to facilitate the reception of back-to-back packets. This enables CRC computation to begin earlier (by looking at a packet in an upstream pipeline register), which facilitates completion of that computation and comparison of the result to the received CRC information in the packet by the time the packet and the CRC check pass/fail signal must be forwarded to MAC layer 720b and 720c. By getting such a head-start on the CRC checking process, the ability of the circuitry to complete the CRC check in time to avoid stalling or delaying the forwarding of packets facilitates the handling of packets back-to-back (i.e., with no gap or delay between successive packets.)

It will be understood that the foregoing is only illustrative of the principles of the invention, and that various modifications can be made by those skilled in the art without departing from the scope and spirit of the invention. For example, the number of lanes that can be used in or with circuitry in accordance with the invention can be any suitable and desired number. Words like "byte" and "word" are used interchangeably herein to refer to any plural number of bits. The word "packet" is used herein to refer to any plural number of bytes or words.

The invention claimed is:

1. A programmable logic device comprising:
   PLD core circuitry;
   receiver circuitry for receiving a serial data signal and converting it to successive parallel words of data that form part of a packet of data; and
   CRC checking circuitry for performing a CRC checking operation on the packet and reporting results of that operation to the PLD core circuitry, the CRC checking circuitry also applying the packet to the PLD core circuitry, and the CRC checking circuitry being at least partly hard-wired for performance of at least some functional aspects of the CRC checking operation.

2. The device defined in claim 1 wherein the receiver circuitry is at least partly hard-wired to perform at least some functional aspects of its operation.

3. The device defined in claim 1 further comprising:
   descrambling circuitry for optionally descrambling the words between the receiver circuitry and the CRC checking circuitry, the descrambling circuitry being at least partly hard-wired to perform at least some functional aspects of its operation.

4. The device defined in claim 1 wherein the CRC checking circuitry comprises:
   two parallel CRC checking circuits.

5. The device defined in claim 1 wherein the CRC checking circuitry comprises:
   pipeline register circuitry from which data can be obtained for use in the CRC checking operation.

6. The device defined in claim 1 wherein the receiver circuitry comprises one of a plurality of lanes of such circuitry, and wherein the CRC checking circuitry combines words from the plurality of lanes to produce the packet.

7. The device defined in claim 6 wherein the CRC checking circuitry comprises:
   lane deskew circuitry for synchronizing the words from the plurality of lanes for production of the packet.

8. A programmable logic device comprising:
   PLD core circuitry for outputting parallel data words that form part of a packet of data;
   CRC generation circuitry for performing a CRC generation operation on the part of the packet and adding the results of that operation to the packet, the CRC generation circuitry being at least partly hard-wired for performance of at least some functional aspects of the CRC generation operation; and
   transmitter circuitry for converting data from the packet to a serial data signal for transmission from the device.

9. The device defined in claim 8 wherein the transmitter circuitry is at least partly hard-wired to perform at least some functional aspects of its operation.

10. The device defined in claim 8 wherein the transmitter circuitry comprises one of a plurality of lanes of such circuitry, and wherein each of the lanes converts a respective portion of the data from the packet to a respective serial data signal.

11. The device defined in claim 8 further comprising:
scrambling circuitry for optionally scrambling the data between the CRC generation circuitry and the transmitter circuitry, the scrambling circuitry being at least partly hard-wired to perform at least some functional aspects of its operation.

12. The device defined in claim 8 wherein the CRC generation circuitry comprises:
two parallel CRC generation circuits.

13. The device defined in claim 8 wherein the CRC generation circuitry comprises:
pipeline register circuitry from which data can be obtained for use in the CRC generation operation.

14. A programmable logic device comprising:
programmable logic circuitry; and
at least partly hard-wired circuitry, the at least partly hard-wired circuitry including:
CRC generation circuitry for performing a CRC operation on data from the programmable logic circuitry and for adding results of that operation to the data to produce a packet of data; and
transmitter circuitry for converting data from the packet to a serial data signal for transmission from the device.

15. The device defined in claim 14 wherein the data from the programmable logic circuitry includes dummy CRC information.

16. The device defined in claim 14 wherein the at least partly hard-wired circuitry further includes:
a plurality of instances of the transmitter circuitry, each of which instances converts a respective portion of the data from the packet to a respective serial data signal for transmission from the device.

17. The device defined in claim 15 wherein the CRC generation circuitry replaces the dummy CRC information with the results of its CRC operation.

18. The device defined in claim 14 wherein the at least partly hard-wired circuitry further includes:
scrambling circuitry for scrambling the data between the CRC generation circuitry and the transmitter circuitry.

19. The device defined in claim 14 wherein the at least partly hard-wired circuitry further includes:
receiver circuitry for receiving a serial data signal and converting it to successive parallel words of data that form part of a received packet of data; and
CRC checking circuitry for performing a CRC checking operation on the received packet and reporting results of that operation to the programmable logic circuitry.

20. The device defined in claim 19 wherein the CRC checking circuitry additionally applies data from the received packet to the programmable logic circuitry.

21. The device defined in claim 19 wherein the at least partly hard-wired circuitry further includes:
descrambling circuitry for descrambling the words between the receiver circuitry and the CRC checking circuitry.

22. The device defined in claim 19 wherein the at least partly hard-wired circuitry further includes:
a plurality of instances of the receiver circuitry, each of which instances receives a respective serial data signal that is converted to parallel words of data that form respective parts of the received packet.

23. The device defined in claim 22 wherein the at least partly hard-wired circuitry further includes:
circuitry for deskewing the words of data from the plurality of instances of the receiver circuitry for use in production of the received packet.

\* \* \* \* \*

UNITED STATES PATENT AND TRADEMARK OFFICE
CERTIFICATE OF CORRECTION

PATENT NO. : 7,627,806 B1
APPLICATION NO. : 11/436463
DATED : December 1, 2009
INVENTOR(S) : Vijayaraghavan et al.

Page 1 of 1

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 810 days.

Signed and Sealed this

Second Day of November, 2010

David J. Kappos
*Director of the United States Patent and Trademark Office*